United States Patent [19]

Kubota et al.

[11] Patent Number: 5,414,654
[45] Date of Patent: May 9, 1995

[54] DRIVING CIRCUIT OF A FERROELECTRIC MEMORY DEVICE AND A METHOD FOR DRIVING THE SAME

[75] Inventors: Yasushi Kubota, Sakurai; Shigeo Onishi, Nara, both of Japan

[73] Assignee: Sharp Kabushiki Kaisha, Osaka, Japan

[21] Appl. No.: 133,253

[22] Filed: Oct. 8, 1993

[30] Foreign Application Priority Data

Oct. 9, 1992 [JP] Japan .................................. 4-271619

[51] Int. Cl.$^6$ ............................................ G11C 11/22
[52] U.S. Cl. ..................................... 365/145; 365/210; 365/149
[58] Field of Search ................ 365/145, 149, 210, 117, 365/189.09

[56] References Cited

U.S. PATENT DOCUMENTS

| | | | |
|---|---|---|---|
| 4,873,664 | 10/1989 | Eaton, Jr. .............................. | 365/145 |
| 5,010,518 | 4/1991 | Toda ..................................... | 365/145 |
| 5,297,077 | 3/1994 | Imai et al. ............................ | 365/145 |

FOREIGN PATENT DOCUMENTS

| | | | |
|---|---|---|---|
| 2-301093 | 12/1990 | Japan . | |
| 3-5996 | 1/1991 | Japan . | |
| 3-283176 | 12/1991 | Japan .................................. | 365/145 |

OTHER PUBLICATIONS

R. Womack et al., *1989 IEEE International Solid-State Circuits Conference*, pp. 242–243, "A 16kb Ferroelectric Nonvolatile Memory with a Bit Parallel Architecture".

*Primary Examiner*—Joseph A. Popek
*Attorney, Agent, or Firm*—Nixon & Vanderhye

[57] ABSTRACT

A ferroelectric memory device according to the present invention comprises a plurality of bit lines carrying data signals and voltage signals, every adjacent two of the bit lines being paired to form a plurality of bit line pairs; sense amplifiers connected to each of the bit line pairs; a plurality of memory cells for storing data, each memory cell having a first capacitor and a first switching element, the first capacitor being connected to one of the bit lines via the first switching element, wherein the first capacitor includes a capacitor insulating film, at least one portion of the capacitor insulating film being formed of a ferroelectric material; a plurality of dummy cells for storing a reference voltage, each dummy cell having a second capacitor and a second switching element, the second capacitor being connected to one of the bit lines via the second switching element, wherein the second capacitor includes the capacitor insulating film at least one portion of the capacitor insulating film being formed of a ferroelectric material; a first common electrode line for controlling a voltage to be applied to the first capacitor; a second common electrode line for controlling a voltage to be applied to the second capacitor; a first word line for controlling the first switching element; and a second word line for controlling the second switching element, wherein a plurality of the memory cells and at least one of the dummy cells are connected to each bit line.

12 Claims, 7 Drawing Sheets

DRIVING CIRCUIT OF A FERROELECTRIC MEMORY DEVICE AND A METHOD FOR DRIVING THE SAME

BACKGROUND OF THE INVENTION

1. Field of the Invention

The present invention relates to a method for driving a ferroelectric memory device, and more particularly to a method for driving a non-volatile semiconductor memory device in which a memory cell for storing data has a capacitor insulating film made from a ferroelectric material.

2. Description of the Related Art

An EPROM and an EEPROM have been put to practical use as a non-volatile memory device among semiconductor memory devices, and used for various kinds of personal computers and information apparatus.

A memory device using the EPROM, the EEPROM, or the like needs a time period for reading data the same as that of a RAM (a DRAM or a SRAM); however, the memory device needs a time period for writing or erasing data which is much longer than that of the RAM by some orders.

The EPROM should be irradiated with ultra violet rays in order to erase data. Thus, it is not easy to incorporate the EPROM into a device. Further, the EPROM should be wrapped with an expensive ceramic package having a quartz window through which ultra violet rays are irradiated. On the other hand, the EEPROM needs a higher voltage or a negative voltage for writing and erasing data. Thus, the EEPROM involves the inconvenience that another power supply is required for writing and erasing data, apart from a power supply for driving the memory device.

In order to solve these problems, a ferroelectric memory device in which a memory cell capacitor has an insulating film made of a ferroelectric substance film has been proposed. FIG. 11 shows a ferroelectric memory device in accordance with a conventional technique (the extended drafts of the International Solid-State Circuits Conference (ISSCC), 1989, p. 242). In this conventional memory device, each memory cell includes two ferroelectric capacitors and two switching transistors. A junction point of two ferroelectric capacitors is connected to a drive line. The memory device is driven by a so-called destructive reading method, and reading/writing data is accompanied with polarization inversion in the ferroelectric film of the capacitor.

When data is written into the memory cell, a + signal and a − signal are given to respective bit lines of each pair of bit lines and the two ferroelectric capacitors are polarized in the opposite direction, respectively. When data is read out from the memory cell, the bit lines are grounded and a pulse voltage is applied to the drive lines. Then, due to the difference in polarization directions of the capacitor insulating films, i.e. whether polarization inversion is caused or not, the potential difference is caused between the bit lines. The potential difference is amplified by a sense amplifier and a signal corresponding to stored data is detected.

In the above-mentioned conventional technique, two ferroelectric capacitors and two switching transistors are required for each memory cell (i.e. 1 bit), so that a chip area of 1 bit memory cell becomes quite large. In order to improve cost competitiveness, however, the chip area should be substantially equivalent to that of the EEPROM, the DRAM, and the like. For this purpose, a 1 capacitor— 1 transistor structure is required for 1 memory cell.

Further, in the conventional technique, due to the destructive-reading, the possible number of times for reading-out from the memory cell is restricted by the operative life time of the ferroelectric film, i.e. the possible number of times for polarization inversion to obtain sufficient polarization. In current ferroelectric materials and process techniques, the operative life time of the ferroelectric film is in the range of $10^9$ to $10^{11}$ times. However, polarization inversion of $10^{15}$ times or more is required in order to use the device for 10 years. Thus, in the conventional techniques, the ferroelectric memory device cannot be available for practical use with a practical operative life time. Accordingly, it is preferable to use a method without polarization inversion for ordinary read/write operations.

SUMMARY OF THE INVENTION

A ferroelectric memory device according to the present invention comprises a plurality of bit lines carrying data signals and voltage signals, every adjacent two of the bit lines being paired to form a plurality of bit line pairs; sense amplifiers connected to each of the bit line pairs; a plurality of memory cells for storing data, each memory cell having a first capacitor and a first switching element, the first capacitor being connected to one of the bit lines via the first switching element, wherein the first capacitor includes a capacitor insulating film, at least one portion of the capacitor insulating film being formed of a ferroelectric material; a plurality of dummy cells for storing a reference voltage, each dummy cell having a second capacitor and a second switching element, the second capacitor being connected to one of the bit lines via the second switching element, wherein the second capacitor includes the capacitor insulating film at least one portion of the capacitor insulating film being formed of a ferroelectric material; a first common electrode line for controlling a voltage to be applied to the first capacitor; a second common electrode line for controlling a voltage to be applied to the second capacitor; a first word line for controlling the first switching element; and a second word line for controlling the second switching element, wherein a plurality of the memory cells and at least one of the dummy cells are connected to each bit line.

Alternatively, a method for driving a ferroelectric memory device according to the present invention including a bit line pair, the bit line pair including a first bit line and a second bit line each for carrying data signals and voltage signals; a sense amplifier connected to the bit line pair; a first capacitor and a second capacitor, each of the first and second capacitors having a capacitor insulating film at least partially formed of a ferroelectric material; a first common electrode line for applying driving voltages for controlling a voltage applied to the first capacitor; and a second common electrode line for applying driving voltages for controlling a voltage applied to the second capacitor, comprises a first operation including a step of keeping the driving voltage always at a source voltage and for driving the memory device without polarization inversion of the capacitor insulating film; a second operation including a step of varying the driving voltage from the source voltage to a ground voltage and controlling the direction of the polarization of the capacitor insulating film of the first capacitor according to the data corresponding to the electric charge stored in the first capacitor; and a third operation including the steps of providing a pulse voltage to the first common electrode line which have been at the ground voltage, inverting the polarization of the capacitor insulating film of the first capacitor according to the direction of the polarization, and then applying the source voltage to the first common electrode line.

In one embodiment of the present invention, the first driving operation includes the steps of: keeping the first common electrode line and the second common electrode line at the source voltage; providing a reference signal to the pair of bit lines; storing a reference electric charge corresponding to the reference signal in the second capacitor; providing the data signal from a peripheral circuit onto the first bit line; storing an electric charge corresponding to the data signal in the first capacitor; reading-out the voltage signal corresponding to the electric charge stored in the first capacitor onto the first bit line; reading-out the reference signal corresponding to the reference charge stored in the second capacitor onto the second bit line; judging the voltage signal on the first bit line by comparing with the reference signal on the second bit line; amplifying the judged voltage signal and providing the resulting data signal to the first bit line; and storing the electric charge corresponding to the data signal in the first capacitor.

In another embodiment of the present invention, the first capacitor comprises a first storage node connected to the first bit line via a first switching element, the electric charge stored in the first capacitor corresponding to the potential difference between the first storage node and the first common electrode line to which the driving voltage is applied, and the second capacitor comprises a second storage node connected to the second bit line via a second switching element, the reference electric charge stored in the second capacitor corresponding to the potential difference between the second storage node and the second common electrode line to which the driving voltage is applied.

In still another embodiment of the present invention, the second driving operation includes the steps of; reading-out the voltage signal from the first capacitor onto the first bit line, reading-out the reference signal from the second capacitor onto the second bit line, judging the voltage signal on the first bit line by comparing with the reference signal on the second bit line, amplifying the judged voltage signal and providing the resulting data signal to the first bit line, storing the electric charge corresponding to the data signal in the first capacitor, varying the voltage of the driving electrode from the source voltage to the ground voltage, and inverting the polarization of the first capacitor insulating film according to the electric charge stored in the first capacitor.

In still another embodiment of the present invention, in the step of inverting the polarization, when the electric charge stored in the first capacitor corresponds to the source voltage, the polarization direction of the capacitor insulating film is inverted, and when the electric charge stored in the first capacitor corresponds to the ground voltage, the polarization direction of the capacitor insulating film is not inverted.

In still another embodiment of the present invention, the third driving operation includes the steps of; providing the reference signal to the pair of bit lines, storing the reference electric charge in the first and second capacitor, respectively, applying a pulse voltage to the first common electrode line which has been at the ground voltage, the pulse voltage having a potential higher than the sum of the reference potential and the threshold voltage causing polarization inversion of the capacitor insulating film, reading-out a potential change signal corresponding to a variation in the reference electric charge stored in the first capacitors when the pulse voltage is applied, providing a predetermined signal for comparing onto the second bit line from the peripheral circuit, comparing the potential change signal with the predetermined signal to judge whether polarization inversion of the first capacitor insulating film has been caused or not, providing the data signal corresponding to the judged result to the first bit line, storing in the first capacitor the electric charge corresponding to the data signal provided by the sense amplifier, and applying the source voltage to the first common electrode line.

In still another embodiment of the present invention, when polarization inversion is caused in the capacitor insulating film, the data signal provided by the sense amplifier is the data signal corresponding to the source voltage, and when polarization inversion has not been caused, the data signal provided by the sense amplifier is the data signal corresponding to the ground voltage.

In still another embodiment of the present invention, the third driving operation further includes the steps of; providing the pulse voltage to the second common electrode line which has been at the ground voltage, after storing the reference electric charge in the second capacitor, and applying the source voltage to the second common electrode line.

In still another embodiment of the present invention, the predetermined signal for comparing has a higher potential than the reference potential.

Thus, the invention described herein makes possible an advantage of providing a method for driving a nonvolatile ferroelectric memory device having a plurality of memory cells each including one transistor and one ferroelectric capacitor without polarization inversion during ordinary read/write operations and with a chip area as small as that of the DRAM and an operative life time for practical use.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

Figure 1:
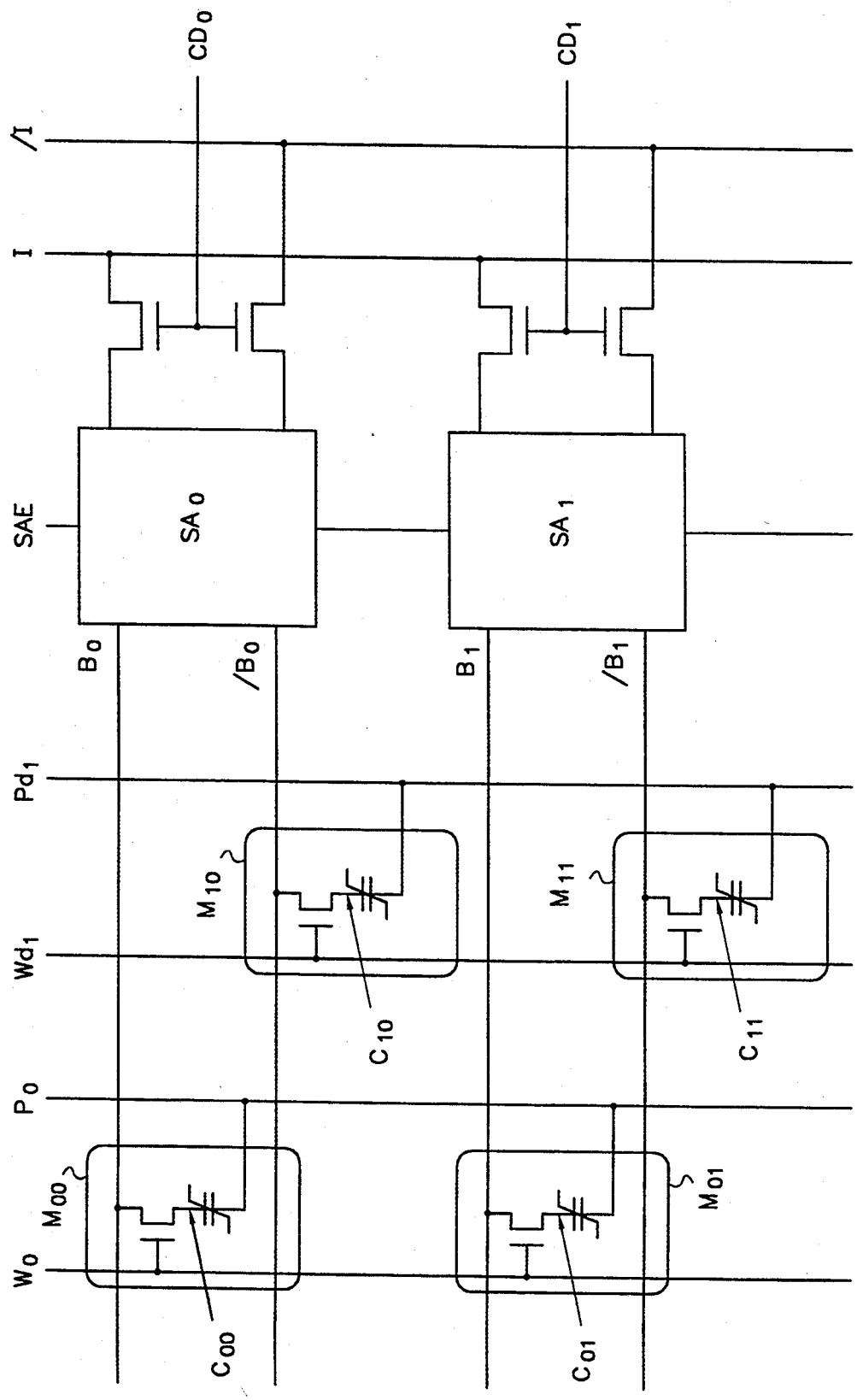
FIG. 1 is a circuitry diagram of a ferroelectric memory device of the present invention.

FIG. 1 shows a circuitry of major portion of a ferroelectric memory device of the present invention. Peripheral circuits and the like that are well known to the skilled person in the art are not shown in FIG. 1. A plurality of bit lines $B_0$, $/B_0$, $B_1$, and $/B_1$ carry data signals and voltage signals. The bit lines are substantially arranged in parallel to one another. The adjacent bit line $B_0$ and $/B_0$, and $B_1$ and $/B_1$ form a pair of bit lines, respectively. Each of the bit lines $B_0$ and $B_1$ is referred to as a first bit line. Each of the bit lines $/B_0$ and $/B_1$ is referred to a second bit line. Each pair of bit lines is connected to a corresponding sense amplifier $SA_0$ or $SA_1$. A plurality of word lines $W_0$ and $W_1$ are disposed to cross the bit lines. A plurality of common electrode lines $P_0$ and $Pd_1$ are provided for the corresponding word lines $W_0$ and $W_1$, respectively. A memory cell $M_{00}$ is provided at the portion where the word line $W_0$ and the bit line $B_0$ are crossing.

The memory cell $M_{00}$ includes a transistor (a switching element) and a capacitor. A source electrode of the transistor is connected to a storage node $C_{00}$ of the capacitor. A drain electrode of the transistor is connected to the bit line $B_0$. A gate electrode of the transistor is connected to the word line $W_0$. The transistor becomes conductive or non-conductive in response to the voltage signal applied to the word line $W_0$.

A cell plate electrode of the capacitor is connected to the common electrode line $P_0$. The storage node of the capacitor is connected to the bit line $B_0$ via the switching element. An electric change stored in the capacitor corresponds to the potential difference between the storage node and the cell plate electrode to which the driving voltage is applied from the common electrode line $P_0$. The capacitor has a capacitor insulating film at least partially made of a ferroelectric material. Hereinafter, the capacitor insulating film is referred to as a capacitor ferroelectric film.

Similarly, a memory cell $M_{01}$ is provided at the intersection of the word line $W_0$ and bit line $B_1$. A memory cell $M_{10}$ is provided at the intersection of the dummy word line $Wd_1$ and bit line $/B_0$. A memory cell $M_{11}$ is provided at the intersection of the dummy word line $Wd_1$ and the bit line $/B_1$. Each of memory cells $M_{01}$, $M_{10}$, and $M_{11}$ includes a transistor and a capacitor as same as the memory cell $M_{00}$. Hereinafter, in this specification, the memory cells $M_{10}$ connected to the bit line $/B_0$, and the memory cell $M_{11}$ connected to the bit line $/B_1$ are referred to as dummy cells. The word line $Wd_1$ connected to the bit lines $/B_0$ and $/B_1$ is referred to the dummy word line. The memory cells $M_{00}$ and $M_{01}$ correspond to the dummy cells $Md_{10}$ and $Md_{11}$, respectively.

The memory cells $M_{00}$ and $M_{01}$ connected to the word line $W_0$ are also connected to the common electrode line $P_0$, and the dummy cells $M_{10}$ and $M_{11}$ connected to the dummy word line $Wd_1$ are also connected to the common electrode line $Pd_1$.

The sense amplifier $SA_0$ judges the voltage signal on the bit line $B_0$, based on the voltage signal on the bit line $/B_0$, and provides a data signal according to the judged results to the bit line $B_0$. The sense amplifier $SA_1$ works in the same manner as that of the sense amplifier $SA_0$. Hereinafter, both sense amplifiers $SA_0$ and $SA_1$ are generally referred to as a sense amplifier SA, unless they should be further classified.

The sense amplifier SA is a differential operating amplifier to amplify a slight potential difference between two voltage signals. The sense amplifier SA compares the voltage signal on the bit line B read out from a memory cell M with the voltage signal (a reference voltage signal) on the corresponding bit line /B read out from the dummy cell Md, and judges which data ("1" or "0") has been stored in the memory cell, depending on whether the voltage signal is larger than the reference voltage or not.

$CD_0$ and $CD_1$ are data line-selecting circuits. The data line-selecting circuit $CD_0$ controls the connection between input-output lines I and /I and the pair of bit lines $B_0$ and $/B_0$. The data line-selecting circuit $CD_1$ controls the connection between the input-output lines I and /I and the pair of bit lines $B_1$ and $/B_1$. An input data signal from the peripheral circuits is written into the memory section via the sense amplifier. Similarly, data stored in the memory section is read out to the peripheral circuits via the sense amplifier.

Figure 2:
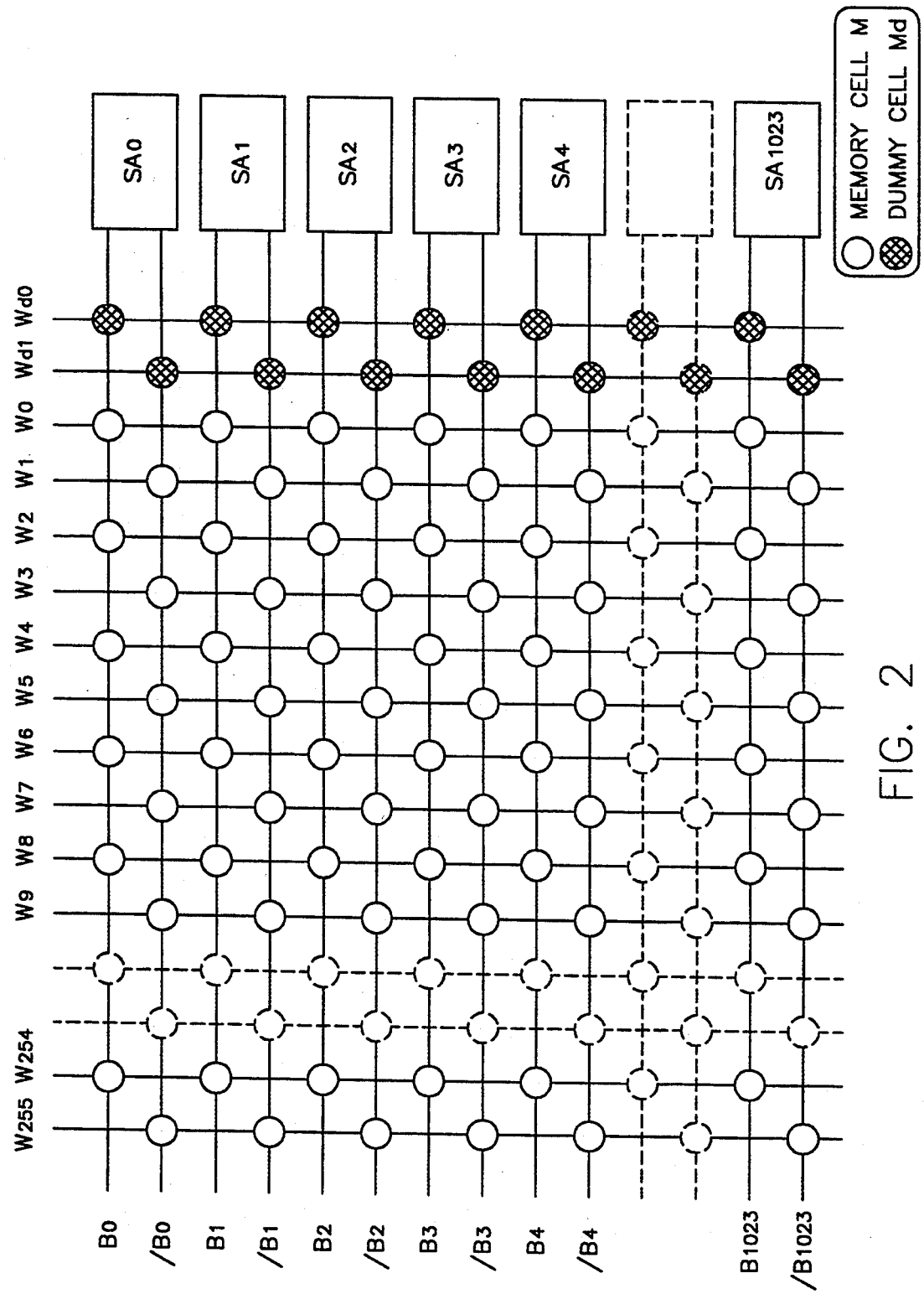
FIG. 2 is a schematic diagram showing a memory block of a ferroelectric memory device of the present invention.

Next, an exemplary structure of a memory cell block will be described with reference to FIG. 2.

Each word line W is connected to 1024 (=K) memory cells M, and each dummy word line Wd is connected to 1024 (=K) dummy cells Md. Hereinafter, numerical number 1024 is referred to as K.

Further, each of the bit lines B and /B is connected to 128 or 256 memory cells M and at least one dummy cell Md. In one pair of bit lines, 128 or 256 memory cells M connected to the bit line B corresponds to at least one dummy cell Md connected to the bit line /B, while 128 or 256 memory cells M connected to the bit line /B corresponds to at least one dummy cell connected to the bit line B. Accordingly, one memory cell block forms an array structure usually including 256 K or 512 K memory cells M and at least 2 K dummy cells Md. Like a dummy cell of an ordinary DRAM, this dummy cell has the same structure as that of the above-mentioned memory cell, and the reference potential usually having a half of a source voltage is written in the dummy cell. There are only two dummy word lines Wd shown in FIG. 2, however more dummy word lines can be provided, if it is desirable.

A method for driving a memory device of the present invention will be now described.

First, a driving method in ordinary read/write operations will be described.

In the ordinary read/write operations, a driving voltage applied to the common electrode lines P and Pd is always maintained at a source voltage V. The capacitor ferroelectric film of the memory cell M causes polarization in response to the voltage applied. However, the memory cell M is driven in a region where polarization direction is not inverted, so that the memory cell M can be used as a volatile memory cell like the ordinary DRAM.

The memory cell $M_{00}$ and the dummy cell $M_{10}$ will be now described as examples of memory cells and dummy cells. Hereinafter, numerical numbers (00, 10, etc.) are omitted, if not necessary. Md is referred to as a dummy cell.

When data written into the memory cell M is "1", the storage node C has a potential $E_V$ corresponding to the source voltage V. When the data written into the memory cell M is "0", the node C has a potential $E_G$ corresponding to a ground voltage $V_G$. The reference signal has been written in the dummy cell Md. A node Cd has a potential $E_0$ corresponding to the reference potential $V_0$. The reference potential $V_0$ is a half of the source voltage V.

A reference signal is written into the dummy cell Md in the following manner.

First, the voltage signal having the reference voltage $V_0$ is applied to the pair of bit lies B and /B. A voltage signal is applied to the word line /W connected to the dummy cell Md so that the transistor of the dummy cell Md is made conductive (Hereinafter, this operation is considered that the dummy word line Wd is activated). Thus, a reference electric charge corresponding to the reference voltage $V_0$ is stored in the capacitor. Accordingly, the potential of the storage node Cd of the dummy cell Md becomes the potential $E_0$ corresponding to the reference potential $V_0$. As can be seen, the potential of the storage node Cd of the dummy cell Md (and that of the storage node C of the memory cell M) corresponds to the electric charge stored in the capacitor, since the potential of the common electrode line P and that of Pd are constant in the read/write operation, respectively.

Figure 3:
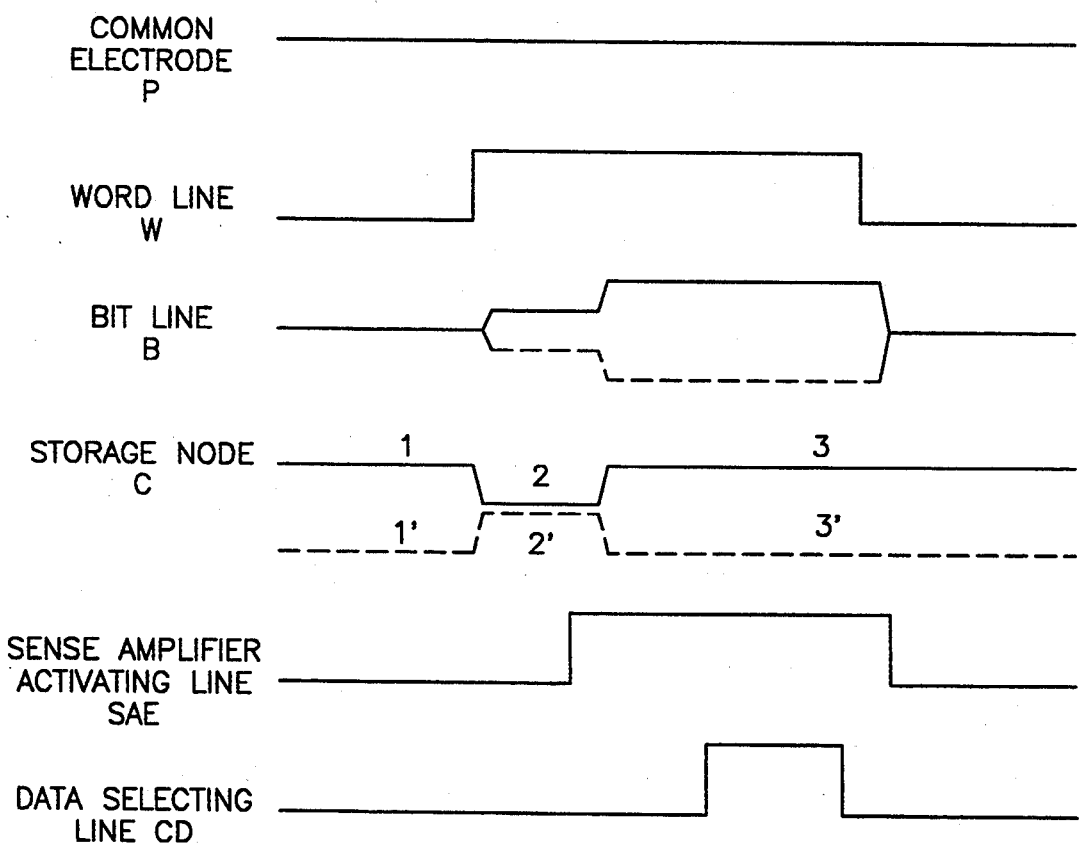
FIG. 3 is a schematic diagram showing the potential waveform of signals during the reading-out operation.
Figure 4:
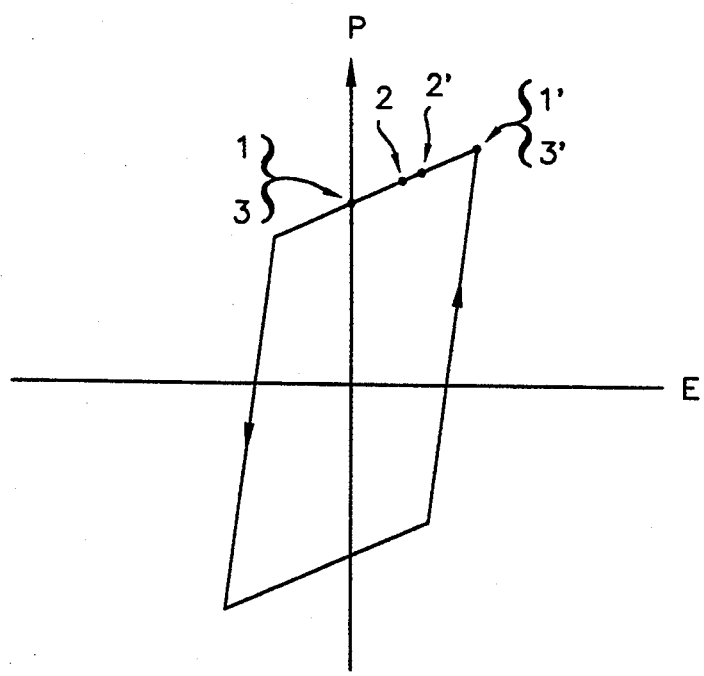
FIG. 4 is a schematic diagram showing electric field-polarization characteristics during the reading-out operation.

The potential waveform of respective signal lines (the common electrode line P, the word line W, and the bit line B) and the storage node C, the activation state (i.e. the operation state) of the sense amplifier SA, and the operation state of the data selecting line CD are schematically shown in FIG. 3, when data stored in the memory cell M is read out. In the potential changes of bit line B or node C shown in FIG. 3, a solid line indicates when data "1" is stored in the memory cell M, and a broken line indicates when data "0" is stored in the memory cell M. FIG. 4 schematically shows the change in polarization of the capacitor ferroelectric film (i.e. voltage-polarization characteristics) corresponding to FIG. 3.

When the word line W connected to a memory cell M is activated, the voltage signal corresponding to data stored in the memory cell M is read out on the corresponding bit line B as shown with 2 or 2'. Simultaneously, when the dummy word line Wd connected to the dummy cell Md is activated, the reference signal is read out on the corresponding bit line /B.

The sense amplifier SA compares the voltage signal on the bit line B with the reference signal on the bit line /B, and judges the voltage signal. When data "1" has been written in the memory cell M, a voltage signal to be read out on the bit line B has a higher potential than that of the reference signal. When data "0" has been written in the memory cell M, the voltage signal to be read out on the bit line B has a lower potential than that of the reference signal. The sense amplifier SA amplifies the above-mentioned slight potential difference between the voltage signal and the reference signal, and provides a data signal corresponding to the source voltage V ("1") or the ground voltage $V_G$ ("0") to the bit line B.

Since the word line has been activated, the same data as the read-out data is re-written into the memory cell M by the data signal provided from the sense amplifier SA. In this case, the storage node C has a potential $E_V$ (3) or $E_G$ (3') corresponding to the source voltage potential or the ground potential, respectively.

When the data selecting line CD is activated, the bit lines B and /B are connected to the input and output lines I and /I, respectively. Thus, the data signal read out from the memory cell M and amplified by the sense amplifier SA is output to the peripheral circuits via the input and output lines I and /I.

After that, the word line W becomes inactive and the data written into the memory cell M is stored therein. Next, the reference potential is provided to the pair of bit lines B and /B, and the reference signal is written into the dummy cell Md. Then, the consequent read/write operations can be readied by making the dummy word line Wd inactive.

Respective polarization states of the capacitor ferroelectric film in the above-mentioned steps are shown with corresponding reference numerals in FIG. 4. The polarization varies depending on the voltage applied to the capacitor ferroelectric film, as indicated by reference numerals 1→2→3 shown in FIG. 4. However, the direction of the electric field to be applied does not vary, so that the polarization direction does not change.

In the above-mentioned ordinary reading-out step, the data is stored with the electric charge in the capacitor (i.e. charge information). The charge information may disappear, as time passes by, due to several kinds of leakage currents such as an OFF current of the transistor, a leakage current at the PN junction of the storage node C of the capacitor, and a leakage current of the capacitor ferroelectric film. Accordingly, like the ordinary DRAM, the refresh (i.e. the re-writing) should be performed for every suitable time period.

Figure 5:
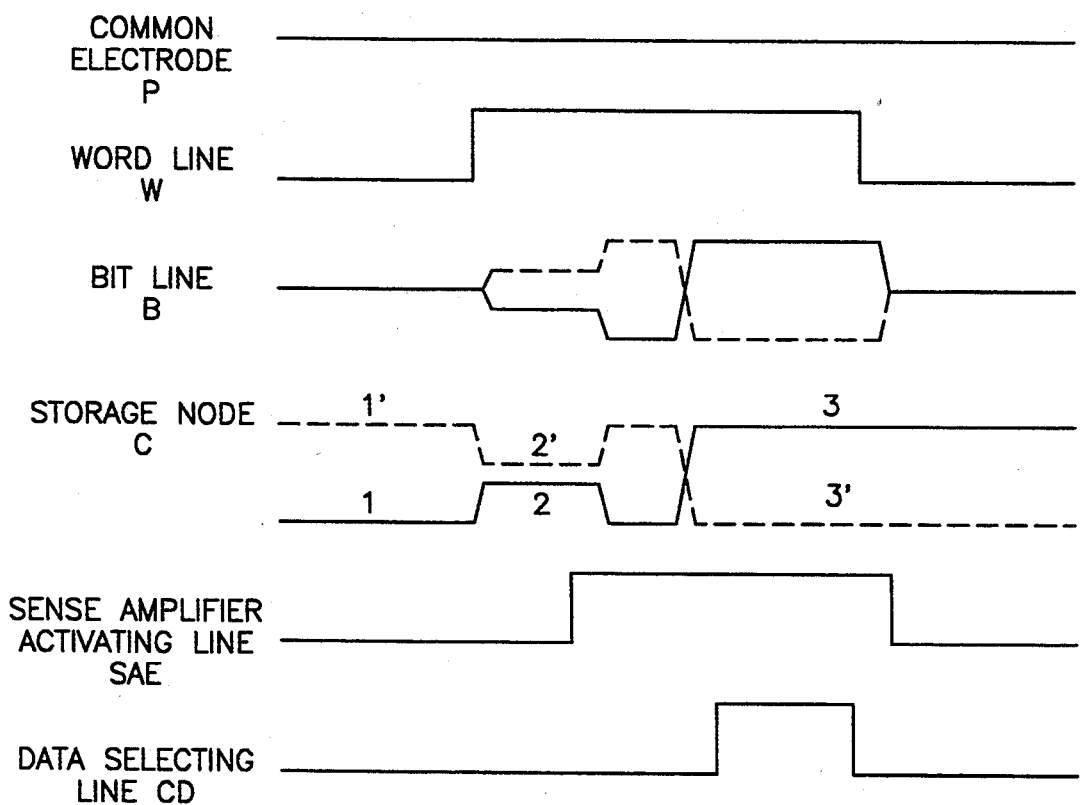
FIG. 5 is a schematic diagram showing the potential waveform of signals during the writing-in operation.
Figure 6:
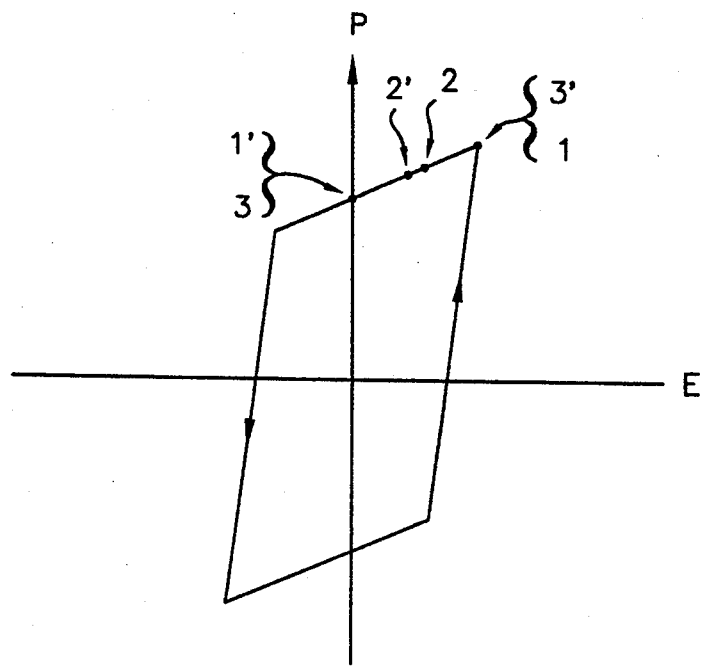
FIG. 6 is a schematic diagram showing electric field-polarization characteristics during the writing-in operation.

An operation of writing the data into the memory cell M will be described with reference to FIGS. 5 and 6. FIGS. 5 and 6 corresponds to FIGS. 3 and 4, respectively.

The writing operation is performed in the same manner as that of the reading operation until the stage that the sense amplifier SA becomes active. In the case of the writing operation, the read-out data is not output to the peripheral circuits when the data selecting line becomes active, but a data signal corresponding to input data inputted from the peripheral circuit is provided to the sense amplifier. The input data is amplified and provided to the bit line B and then written into the memory cell M. Reference numerals 1, 2, and 3 described with a solid line in FIG. 5 indicates potential changes where newly input data "1" is written into the memory cell in which data "0" has originally been stored. Reference numerals 1', 2', and 3' described in a broken line indicates potential changes where newly input data "0" from outside is written into the memory cell M in which data "1" has originally been stored.

On the other hand, another pair of bit lines B and /B to which no input data signal is applied is provided a data signal corresponding to the read-out data. Thus, the read-out data is re-written into the memory cell without being changed.

After that, the word line W is made inactive and written-in data is stored in the memory cell M in the same manner as that of the reading operation of the data. Then, the reference potential is provided to the pair of bit lines B and /B, and the reference signal is written into the dummy cell Md. Then, the consequent reading and writing operation can be readied by making the dummy word line /Wd inactive.

As is mentioned above, in the read/write operations, the electric field applied to the capacitor ferroelectric film is always in the same direction. Accordingly, as is shown in FIGS. 4 and 6, the capacitor ferroelectric film does not cause polarization inversion. Therefore, the ferroelectric film is used just as a capacitor film having a high dielectric constant in the ordinary write/read operations, and the ferroelectric film will be much less deteriorated.

An operation just before the power supply of the memory device is interrupted will be now described.

Before turning off the power supply, the memory cell which has been used as the above-mentioned volatile memory is converted into a nonvolatile memory. When the power supply is to be turned off, data stored in each memory cell M is successively refreshed by each word line W. Then, in a state where the data is re-written into the memory cell M (i.e. a potential corresponding to the data signal is provided to the storage electrode of the capacitor), the voltage applied to the common electrode line P is varied from the source voltage V to the ground voltage $V_G$, thereby inverting polarization of the capacitor ferroelectric film in the memory cell which stores the data "1".

Polarization of the ferroelectric material is not diminished for a long time period when the electric field does not exist. Accordingly, even when the power supply is turned off (i.e. no electric field is applied), the data of the memory cell is stored with polarization for a long time period, thereby realizing a nonvolatile memory cell.

The operation just before turning off the power supply (the ending operation) will be now described in detail with reference to FIGS. 7 and 8.

Figure 7:
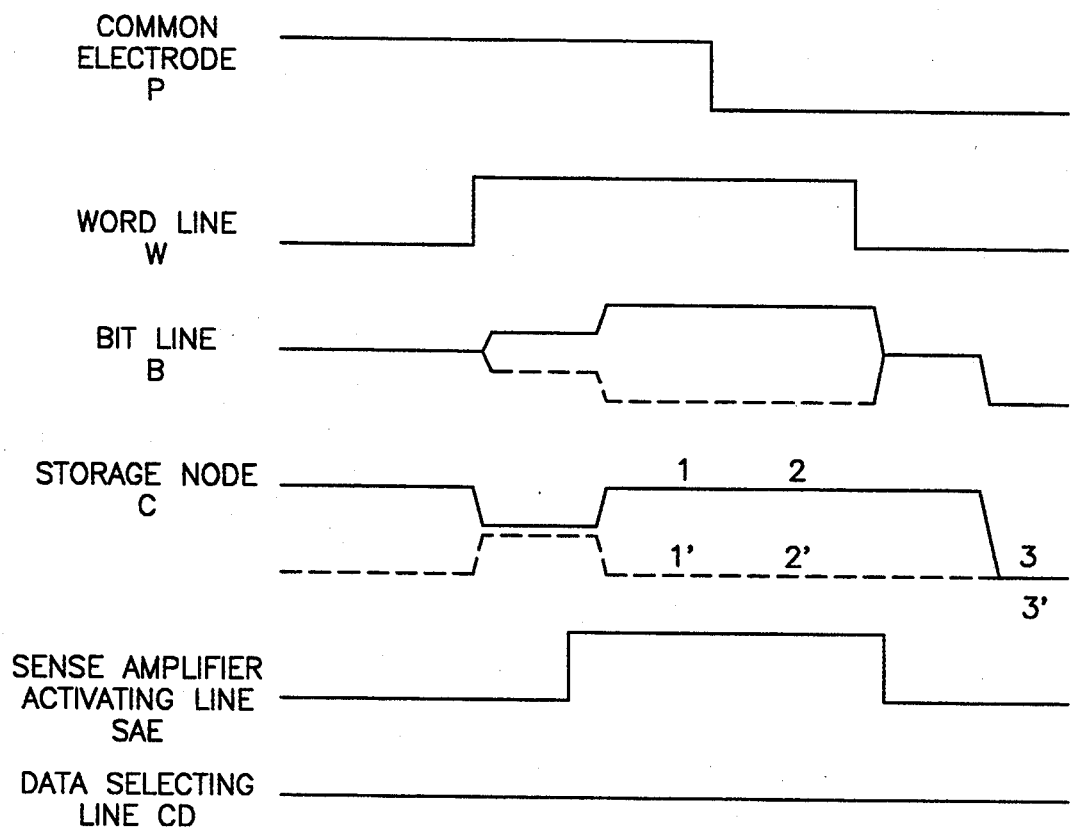
FIG. 7 is a schematic diagram showing the potential waveform signals during the operation just before turning off the power supply of the device.
Figure 8:
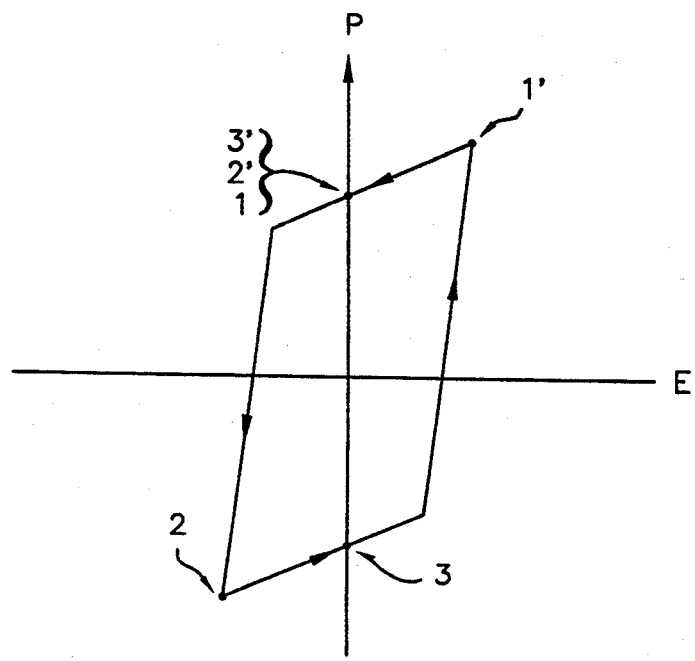
FIG. 8 is a schematic diagram showing electric field-polarization characteristics during the operation before turning off the power supply of the device.

The potential waveforms of each signal line and the storage node C, the activation state of the sense amplifier SA, and the operation state of the data selecting line CD are schematically shown in FIG. 7, when the voltage source of the memory device is to be interrupted. In the potential waveforms of the bit line B and the storage node C, a solid line indicates when the data "1" is stored in the memory cell M, and a broken line indicates when the data "0" is stored in the memory cell M. FIG. 8 schematically shows voltage-polarization characteristics of the capacitor ferroelectric film.

First, the voltage signal corresponding to the stored data is read-out on the bit line B from the memory cell M and the reference signal is read-out on the bit line /B from the dummy cell Md, in the same manner as that of the ordinary reading operation. Then, the sense amplifier SA compares the voltage signal with the reference signal, and judges whether the voltage signal corresponds to the data "1" or the data "0". According to the judged results, when the voltage signal corresponds to the data "1", the source voltage is applied to the bit line B and the data "1" is written into the memory cell M, while the voltage signal corresponds to the data "0", the ground voltage is applied to the bit line B and the data "0" is written into the memory cell M (see 1 or 1' in FIG. 7). While the storage electrode node of the capacitor of the memory cell has the potential level corresponding to each data, the voltage applied to the common electrode line varies from the source voltage V to the ground voltage $V_G$ as shown with numeral 2 or 2' in FIG. 7.

In this case, in the memory cell M in which the data "1" has been stored, the direction of the electric field applied to the capacitor ferroelectric film is inverted. The electric field in the opposite direction is large enough to invert polarization of the capacitor ferroelectric film. As is shown in FIG. 8, polarization of the capacitor ferroelectric film is inverted from 1 to 2 as the voltage applied to the common electrode line varies from the source voltage to the ground voltage. In the memory cell M in which the data "0" has been stored, although the electric field applied to the capacitor ferroelectric film becomes 0, the direction thereof is not inverted. Accordingly, in the memory cell M in which the data "0" has been stored polarization of the capacitor ferroelectric film is not inverted (see 1', 2' in FIG. 8).

As is mentioned above, the charge informations of the capacitor corresponding to the data "1" and "0" are converted into an inverted polarization state and a non-inverted polarization state of the capacitor ferroelectric film (i.e. polarization information), respectively.

In the dummy cell Md, the voltage applied to the common electrode line Pd does not vary from the source voltage to the ground voltage. The polarization inversion is not caused by varying the potential of the common electrode line. The potentials of the storage node Cd and the common electrode line Pd are reduced to the ground potential due to the leakage current. Accordingly, the polarization may spontaneously occur according to which of the potentials becomes ground potential faster.

The above-mentioned operations are applied to each word line W, and then the data stored in all memory cells M are converted from the charge information into the polarization information. The power supply of the memory device is interrupted, after converting the data for every memory cell M is finished.

After turning off the power supply, due to the above-mentioned several leakage currents, the electric charge maintained in the storage electrode node of the capacitor begins to gradually disappear and the potential of the storage node C begins to slowly drop. After a sufficient period of time, the potential of the storage node C becomes the ground potential and the electric field between the capacitor electrode becomes 0 (see 3 or 3' in FIG. 7). Further, polarization of the capacitor ferroelectric film varies to 3 or 3' as shown in FIG. 8. The states of 3 and 3' in FIGS. 7 and 8 is maintained until the power supply is applied again in the memory device.

In the above-mentioned operations, when the storage electrode node of the capacitor is at the potential $E_V$ corresponding to the source voltage V, and a common electrode falls down to the ground potential $E_G$, polarization of the capacitor ferroelectric is inverted. Accordingly, it is desired to select an appropriate thickness of the ferroelectric film in order to invert polarization thereof by applying to the ferroelectric film the electric field corresponding to the potential difference between the potential $E_V$ almost equal to the source voltage V and the ground potential $E_G$ almost equal to 0. That is, the thickness should be selected so that the threshold voltage causing polarization inversion may be set at less than the above-mentioned potential difference.

A driving method for just after turning on the power supply of the memory device will be now described.

Figure 9:
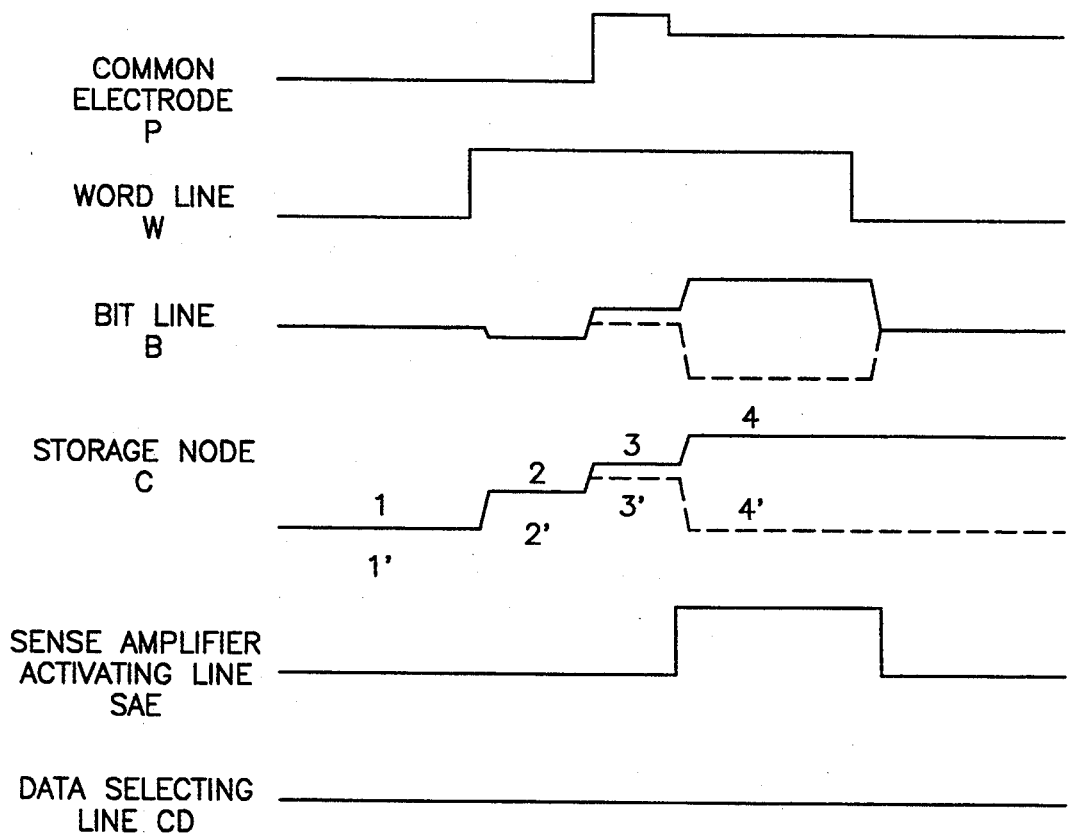
FIG. 9 is a schematic diagram showing the potential waveform of signals during the operation just after turning on the power supply of the device.
Figure 10:
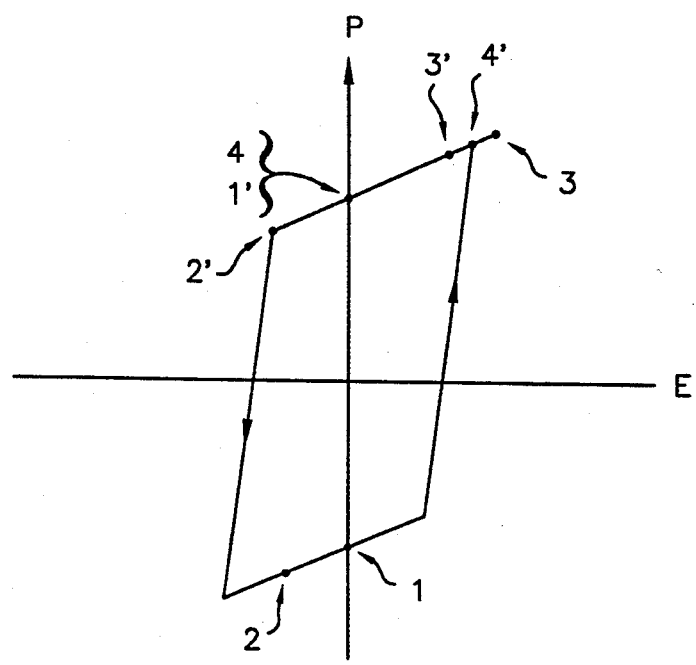
FIG. 10 is a schematic diagram showing electric field-polarization characteristics during the operation just after turning on the power supply of the device.
Figure 11:
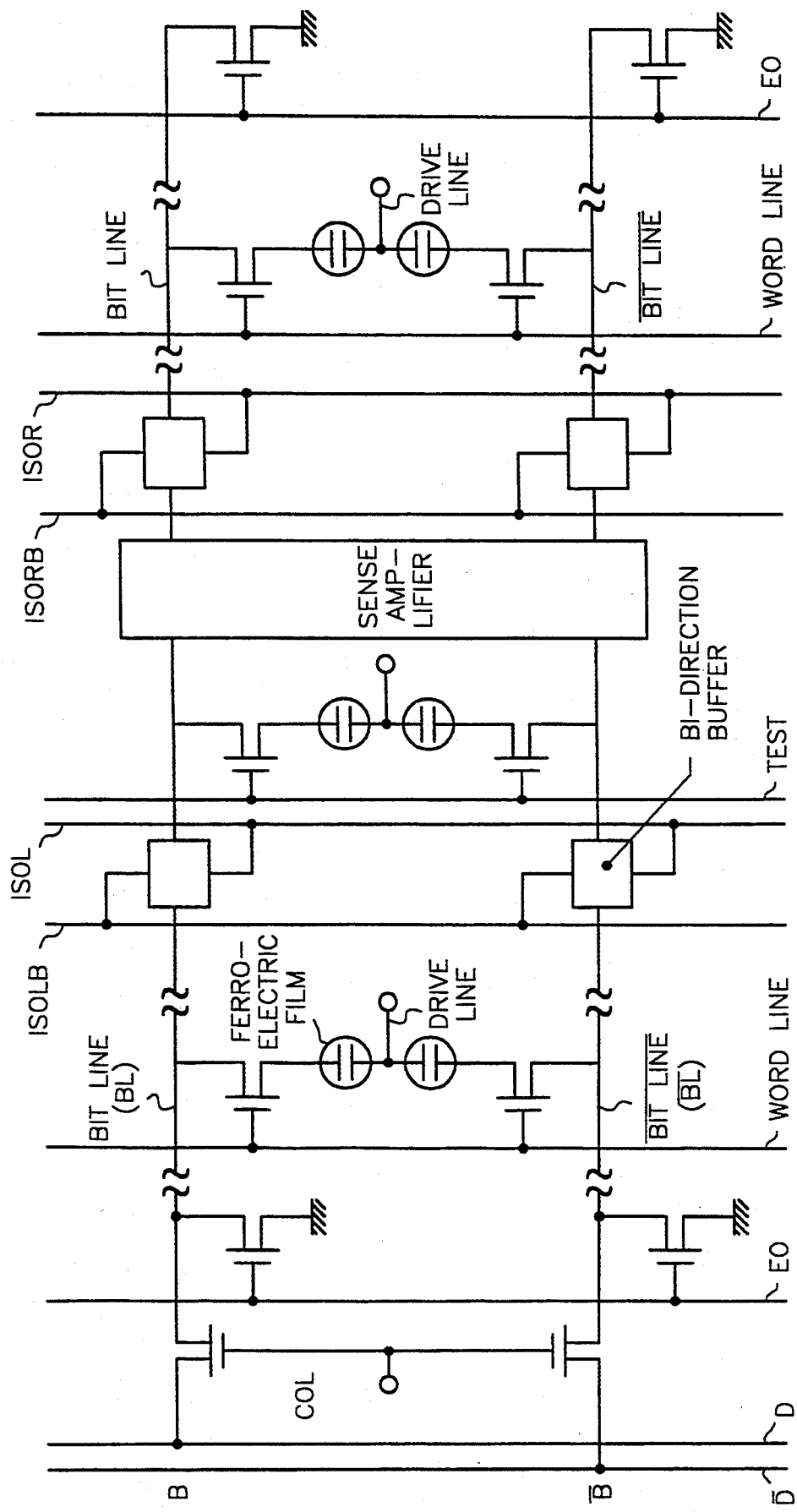
FIG. 11 is a circuitry diagram of a conventional ferroelectric memory device.

After turning on the power supply of the memory device, the data which has been stored in the memory cell as the polarization information of the capacitor ferroelectric film is converted into the charge information again. This starting operation will be described with reference to FIGS. 9 and 10.

First, the common electrode lines P of the memory cells M are all at the ground voltage $V_0$. In this case, polarization of the capacitor ferroelectric film is in the state shown as 1 and 1' in FIG. 10. In this state, the word line W is activated and then the reference potential $E_0$ is written into the storage node C. The polarization state varies from 1 to 2 or from 1' to 2' in FIG. 10. The direction of the electric field applied to the capacitor in the time of starting operation is opposite to that in the read/write operations. Thus, care should be taken that polarization of the ferroelectric film is not inverted in order to prevent the stored data from being broken. For this purpose, the thickness of the ferroelectric film should be selected appropriately, so that the threshold voltage thereof be set larger than the applied-voltage difference. The applied voltage difference means the difference between the potential of the bit line B and the ground potential when a signal corresponding to the ground potential is read from the memory cell on the bit line B on which the reference potential is applied, and is almost equal to the difference between the ground potential and the reference potential. In this example, the applied voltage difference is approximately one half of the source voltage.

After that, the pulse voltage signal having a higher potential than the sum of the reference potential and the threshold voltage is applied to the common electrode line. The pulse voltage signal has a potential approximately one and half times as large as the source voltage. When the pulse voltage is applied, the polarization is inverted again as shown with numerals 2→3 in FIG. 10 in the memory cell M having the polarization information corresponding to the data "1". In the memory cell M having the data "1", the polarization of the ferroelectric film had been inverted while the ending operation was performed. On the other hand, in the memory cell M having the polarization information corresponding to the data "0", i.e. in the memory cell M in which polarization has not been inverted during the ending operation, polarization had not inverted as shown with numerals 2'→3' in FIG. 10.

Because of the polarization inversion caused by applying the pulse voltage signal, the electric charge of the storage electrode node varies in quantity. This variation makes a difference in the voltage signal to be read-out on the bit line B. Accordingly, the voltage signal varies corresponding to whether polarization is inverted or not. The difference between the voltage signal with polarization inversion and that without polarization inversion is judged by the sense amplifier SA. Then, the data signal corresponding to the source voltage or the ground voltage in accordance with the judged results is applied to the bit line B. Thus, the data which has been stored in the memory cell as polarization information is converted and re-written into the memory cell as charge information of the capacitor. In this case, the polarization state is represented as indicated by the numeral 4 or 4' in FIG. 10.

The following disadvantage may be caused, when the polarization information is converted into the charge information, if the data corresponding to the signal voltage is judged by comparing the voltage signal on the bit line B read-out from the memory cell M with the reference signal on the bit line /B read-out from the dummy cell Md (in this case the capacitor in the dummy cell may have a half of the capacitance of that in the memory cell). When converting the polarization information into the charge information, 128 or 256 memory cells M connected to one bit line B corresponds to one dummy cell Md connected to one bit line /B. Thus, polarization of the capacitor ferroelectric film of the dummy cell might be inverted more times by 2 orders or more than that of the capacitor ferroelectric film of the dummy cell. Accordingly, the operative life time of the memory device is restricted by that of the capacitor ferroelectric film of the dummy cell, so that the operative life time of the device is shortened in more times by 2 orders or more.

Accordingly, it is preferable that when the polarization information is read-out, a predetermined potential for comparing is provided onto the bit line /B from the peripheral circuits not to use the dummy cell Md and that the voltage signal on the bit line B is judged by being compared with the predetermined potential for comparing. The potential of the bit line B on which the polarization information is read-out is higher than the reference potential in both areas with polarization inversion and without polarization inversion. Accordingly, the predetermined potential for comparing should be set higher than the reference potential which is substantially equivalent to a half of the source voltage in order to detect the difference between the potential level with the polarization inversion and that without the polarization inversion. Further, the predetermined potential for comparing should be set between the potential with polarization inversion and that without polarization inversion.

In addition, before the ordinary read/write operation is performed again, the charge information of the reference potential should be written into the dummy cell Md. The writing-in operation of the reference potential is performed as follows. First, reference potential is provided to the dummy cell Md from the bit line B or /B. And then the pulse voltage may be applied to the common electrode line at the ground voltage connected to the dummy cell. And the source voltage is applied to the common electrode line.

The pulse voltage may be applied so that the polarization direction of the capacitor ferroelectric film of the dummy cell Md is aligned to the polarization direction of the capacitor ferroelectric film of the memory cell and then the reference voltage is written into the dummy cell Md.

In the dummy cell Md, the polarization has not been inverted by varying the potential of the common electrode line. However, the potentials of the storage node Cd and the common electrode line Pd are reduced to the ground potential due to the leakage current. Accordingly, the polarization may spontaneously occur according to which of the potentials becomes ground potential faster. It is preferable that the pulse voltage is applied to the dummy cell.

In the dummy cell Md, the polarization has not been inverted by varying the potential of the common electrode line. However, the potentials of the storage node Cd and the common electrode line Pd are reduced to the ground potential due to the leakage current. Accordingly, the polarization may spontaneously occur according to which of the potentials becomes faster the ground potential. It is preferable that the pulse voltage is applied to the dummy cell.

In the memory device of the present invention, polarization of the capacitor ferroelectric film is inverted only when the power supply of the memory device is turned off and the power supply is turned on, so that the ferroelectric film is prevented from deterioration, thereby providing a ferroelectric memory device having an operative life time long enough for practical use.

Further, since the conversion of the charge information into the polarization information and the conversion of the polarization information into the charge information are performed for every word line, the conversion is simultaneously performed in as many memory cells as there are the sense amplifiers. Accordingly, the inversion can be performed in a time period shorter than that for the refresh in the ordinary read/write operations in the conventional method, in which the number of the memory cells in which the data is refreshed at the same time is one eighth of the number of sense amplifiers in a typical 16 Mb DRAM. However, it should be noted that if the data of too many memory cells are converted at once, the potential level of a power supply is changed by the increase of a peak current, resulting in a breakdown of the data.

As is mentioned above, a ferroelectric memory device of the present invention has a memory cell including a transistor and a ferroelectric capacitor, thereby obtaining a chip area as small as that of the DRAM. Further, according to the driving method of the present invention, polarization inversion is not caused in the ordinary read/write operations, thereby obtaining a nonvolatile ferroelectric memory device having an operative life time for practical use.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ferroelectric memory device, comprising:
a plurality of bit lines carrying data signals and voltage signals, every adjacent two of the bit lines being paired to form a plurality of bit line pairs;
sense amplifiers connected to each of the bit line pairs;
a plurality of memory cells for storing data, each memory cell having a first capacitor and a first switching element, the first capacitor being connected to one of the bit lines via the first switching element, wherein the first capacitor includes a capacitor insulating film, at least one portion of the capacitor insulating film being formed of a ferroelectric material;
a plurality of dummy cells for storing a reference voltage, each dummy cell having a second capacitor and a second switching element, the second capacitor being connected to one of the bit lines via the second switching element, wherein the second capacitor includes the capacitor insulating film at least one portion of the capacitor insulating film being formed of a ferroelectric material;
a first common electrode line for controlling a voltage to be applied to the first capacitor;
a second common electrode line for controlling a voltage to be applied to the second capacitor;
a first word line for controlling the first switching element; and
a second word line for controlling the second switching element,
wherein a plurality of the memory cells and at least one of the dummy cells are connected to each bit line, and wherein each of the memory cells and each of the dummy cells have substantially the same structure and the same capacitance.

2. A method for driving a ferroelectric memory device including: a bit line pair, the bit line pair including a first bit line and a second bit line each for carrying data signals and voltage signals; a sense amplifier connected to the bit line pair; a first capacitor and a second capacitor, each of the first and second capacitors having a capacitor insulating film at least partially formed of a ferroelectric material; a first common electrode line for applying a driving voltage for controlling a voltage applied to the first capacitor; and a second common electrode line for supplying a driving voltage for controlling a voltage applied to the second capacitor, comprising:
a first operation including a step of always keeping the driving voltage of the first common electrode line and the second common electrode line at a source voltage and driving the memory device without polarization inversion of the capacitor insulating film during the first operation;
a second operation including a step of varying the driving voltage of the first common electrode line from the source voltage to a ground voltage and controlling the direction of the polarization of the capacitor insulating film of the first capacitor, the direction of the polarization being controlled based on an electric charge having been stored in the first capacitor; and
a third operation including the steps of providing a pulse voltage to the first common electrode line which had been at the ground voltage, inverting the polarization of the capacitor insulating film of the first capacitor based on the direction of the polarization, and then applying the source voltage to the first common electrode line.

3. A driving method according to claim 2, wherein the first driving operation includes the steps of:
providing a reference signal to the pair of bit lines;
storing a reference electric charge corresponding to the reference signal in the second capacitor;
providing a data signal from a peripheral circuit onto the first bit line;
storing an electric charge corresponding to the data signal in the first capacitor;
reading-out the voltage signal corresponding to the electric charge stored in the first capacitor onto the first bit line;
reading-out the reference signal corresponding to the reference charge stored in the second capacitor onto the second bit line;
comparing the voltage signal on the first bit line with the reference signal on the second bit line to determine the data corresponding to the voltage signal on the first bit line;
providing the data signal corresponding to the determined data to the first bit line; and
storing the electric charge corresponding to the data signal in the first capacitor.

4. A driving method according to claim 3, wherein the first capacitor comprises a first storage node connected to the first bit line via a first switching element, the electric charge stored in the first capacitor corresponding to the potential difference between the first storage node and the first common electrode line to which the driving voltage is applied, and the second capacitor comprises a second storage node connected to the second bit line via a second switching element, the reference electric charge stored in the second capacitor corresponding to the potential difference between the second storage node and the second common electrode line to which the driving voltage is applied.

5. A driving method according to claim 2, wherein the second driving operation includes the steps of:

reading-out the voltage signal corresponding to the electric charge stored in the first capacitor onto the first bit line, reading-out the reference signal corresponding to the reference charge stored in the second capacitor onto the second bit line, comparing the voltage signal on the first bit line with the reference signal on the second bit line to determine the data corresponding to the voltage signal on the first bit line, providing the data signal corresponding to the determined data to the first bit line, storing the electric charge corresponding to the data signal in the first capacitor, varying the driving voltage of the first common electrode line from the source voltage to ground voltage, and inverting the polarization of the first capacitor insulating film according to the electric charge having been stored in the first capacitor.

6. A driving method according to claim 5, wherein in the step of inverting the polarization, when the electric charge stored in the first capacitor corresponds to the source voltage, the polarization direction of the capacitor insulating film is inverted, and when the electric charge stored in the first capacitor corresponds to the ground voltage, the polarization direction of the capacitor insulating film is not inverted.

7. A driving method according to claim 2, wherein the third driving operation includes the steps of:

providing the reference signal to the pair of bit lines, storing the reference electric charge in the first and second capacitor, respectively, applying a pulse voltage to the first common electrode line which has been at the ground voltage, the pulse voltage having a potential higher than the sum of a potential of the reference signal and a threshold voltage causing polarization inversion of the capacitor insulating film, reading-out a potential change signal corresponding to a variation in the reference electric charge stored in the first capacitors when the pulse voltage is applied, providing a predetermined signal for comparing onto the second bit line from the peripheral circuit, applying the source voltage to the first common electrode line, comparing the potential change signal with the predetermined signal and detecting the polarization inversion of the first capacitor insulating film, providing the data signal corresponding to the detected polarization to the first bit line, and storing in the first capacitor the electric charge corresponding to the data signal provided by the sense amplifier.

8. A driving method according to claim 7, wherein when polarization inversion is caused in the capacitor insulating film, the data signal provided by the sense amplifier is the data signal corresponding to the source voltage, and when polarization inversion has not been caused, the data signal provided by the sense amplifier is the data signal corresponding to the ground voltage.

9. A driving method according to claim 7, wherein the third driving operation further includes the steps of; providing the pulse voltage to the second common electrode line which has been at the ground voltage, after storing the reference electric charge in the second capacitor, and applying the source voltage to the second common electrode line.

10. A driving method according to claim 7, wherein the predetermined signal for comparing has a higher potential than the reference potential.

11. A ferroelectric memory device according to claim 1, wherein the first common electrode line is provided for each corresponding first word line, and the second common electrode line is provided for each corresponding second word line.

12. A ferroelectric memory device according to claim 1, wherein each of the plurality of memory cells and the plurality of dummy dells has an 1-capacitor/1-transistor structure.

* * * * *